(12) United States Patent
Chiang

(10) Patent No.: US 7,847,420 B2
(45) Date of Patent: Dec. 7, 2010

(54) SURFACE MOUNTING STRUCTURE FOR BALL GRID ARRAY

(75) Inventor: Yi Yen Chiang, Taipei (TW)

(73) Assignee: Micro-Star Int'l Co., Ltd., Jung-He (TW)

( * ) Notice: Subject to any disclaimer, the term of this patent is extended or adjusted under 35 U.S.C. 154(b) by 175 days.

(21) Appl. No.: 12/358,269

(22) Filed: Jan. 23, 2009

(65) Prior Publication Data

US 2010/0124830 A1    May 20, 2010

(30) Foreign Application Priority Data

Nov. 14, 2008  (TW) .............................. 97144230 A

(51) Int. Cl.
*H01L 23/48* (2006.01)
*H01L 23/52* (2006.01)
*H01L 29/40* (2006.01)

(52) U.S. Cl. ................ 257/786; 257/780; 257/E23.015

(58) Field of Classification Search ................ 257/780, 257/786, E23.015
See application file for complete search history.

(56) References Cited

U.S. PATENT DOCUMENTS

| | | | |
|---|---|---|---|
| 5,872,399 A | * | 2/1999 | Lee ............................. 257/738 |
| 6,927,491 B1 | | 8/2005 | Yamada |
| 7,042,098 B2 | * | 5/2006 | Harun et al. ................. 257/774 |
| 7,088,008 B2 | * | 8/2006 | Alcoe et al. .................. 257/786 |
| 7,173,342 B2 | * | 2/2007 | Tay et al. .................... 257/786 |
| 7,723,855 B2 | * | 5/2010 | Tsai et al. .................... 257/786 |

FOREIGN PATENT DOCUMENTS

| CN | 1742371 | 1/2004 |
|---|---|---|
| TW | 461053 | 11/1999 |

* cited by examiner

*Primary Examiner*—David A Zarneke
*Assistant Examiner*—Jenny L Wagner
(74) *Attorney, Agent, or Firm*—Ditthavong Mori & Steiner, P.C.

(57) ABSTRACT

A surface mounting structure applied to a BGA includes a substrate, a first soldering pad, a first lead, a second lead and a passivation layer. The substrate has a top surface for the first soldering pad to be disposed thereon. The first lead has a first end connected to the first soldering pad and a second end. The second lead has a third end connected to the first soldering pad and a fourth end connected to the second end of the first lead. A well is defined among the first lead, the second lead, and the first soldering pad. The passivation layer covers the top surface of the substrate, and has a first opening corresponding to the top of the first soldering pad to expose the first soldering pad and the well. Chip failure resulting from the warp occurring at four corners in the surface mounting procedure is prevented.

20 Claims, 9 Drawing Sheets

SURFACE MOUNTING STRUCTURE FOR BALL GRID ARRAY

CROSS-REFERENCES TO RELATED APPLICATIONS

This non-provisional application claims priority under 35 U.S.C.§119(a) on Patent Application No(s). 97144230 filed in Taiwan, R.O.C. on 2008 Nov. 14, the entire contents of which are hereby incorporated by reference.

BACKGROUND OF THE INVENTION

1. Field of the Invention

The present invention relates to Surface Mounting Technology (SMT), and more particularly to a surface mounting structure applied to a ball grid array (BGA) that prevents soldering failures in four corners of a chip substrate.

2. Related Art of the Invention

Nowadays, semiconductor chips are becoming thinner and smaller in size, yet higher processing speeds are required. SMT (Surface Mounting Technology) for a BGA (Ball Grid Array) is well developed as a result.

However, a result of the actual implementation of the surface mounting process in the prior art, a concentration of heat occurs in four corners of a chip substrate. Solder balls in the four corners therefore need to be improved with better heat dissipation. A conventional method of enhancing heat dissipation is to add an extension portion outwards from the soldering pad to increase the heat-dissipation surface of the soldering pad. Yet an extension portion extending from the soldering pad creates a smaller lateral contact surface between the solder ball and the soldering pad. Meanwhile the four corners of the substrate develop wraps under high temperature. This causes extra stresses on the solder balls, so that the solder balls fail to perfectly solder with the soldering pads in the four corners of the substrate. In view of the problem, several solutions in the prior are proposed.

In R.O.C (Taiwan) Patent No. 461053, a metal enhancing layer is applied to those portions surrounding the under surface of the substrate to strengthen the substrate and prevent the substrate from being wrapped under high temperature. However, such a solution increases the complexity and cost of the manufacturing process.

In P.R.C. (China) Patent No. CN 1742371A, virtual balls without electrical connections are applied to the four corners of the BGA package to increase SMT soldering reliability. However, such a solution wastes space on the chip.

In U.S. Pat. No. 6,927,491B1, larger solder balls are applied to the four corners of the BGA package structure, thereby increasing SMT soldering reliability However, such a solution also incurs the problem of wasting space on the chip.

Other approaches to increasing the SMT soldering reliability in the four corners of the BGA package include applying glue to the four corners of the BGA package, or adding a metal frame surrounding the BGA package. However, these solutions also increase the complexity either cost of the manufacturing process or troubleshooting.

The aforesaid technologies in the prior art all address the soldering failure problem of the four corners during the SMT manufacturing processes. However, those solutions incur problems including increasing the complexity and cost of manufacturing processes, and wasting space on the chip.

SUMMARY OF THE INVENTION

Accordingly, a surface mounting structure for a BGA (Ball Grid Array) is provided in the present invention. The surface mounting structure includes a substrate, at least one first soldering pad, at least one first lead, at least one second lead, and a passivation layer. The substrate has a top surface, and the first soldering pad is disposed on the top surface. The first lead has a first end and a second end, wherein the first end is connected to the first soldering pad. The second lead has a third end and a fourth end, wherein the third end is connected to the first soldering pad and the fourth end is connected to the second end of the first lead. A well is defined between the first lead and the second lead, and the first soldering pad. Furthermore, the passivation layer covers the top surface of the substrate, and has a first opening disposed corresponding to the top of the first soldering pad to expose the first soldering pad and the well.

Furthermore, the first soldering pad of the present invention has a top soldering surface at a top side of the first soldering pad, a first lateral soldering surface at a lateral side of the first soldering pad, and a second lateral soldering surface located at another lateral side of the first soldering pad and in the well.

By increasing the lead amount of the first soldering pad, the present invention completes the soldering operation between the solder (such as the tin ball), and the first soldering pad. When being cooled, the first soldering pad will be cooled faster, since the first soldering pad is connected to more leads, the cooling rate of the first soldering pad is higher than that of the other soldering pads connected to only one lead. In addition, the present invention further utilizes the first lead and the second lead to surround the first soldering pad and define the well, thereby the solder not only being soldered onto the top soldering surface and the first lateral soldering surface of the first soldering pad, but also soldered onto the second lateral soldering surface of the first soldering pad through the well.

The present invention also discloses a surface mounting structure applied to a BGA package. The surface mounting structure includes a substrate, at least one first soldering pad, at least one extension portion and a passivation layer. The first soldering pad is disposed on the top surface of the substrate. The extension portion is connected to the first soldering pad, and a well is defined at a connection area of the extension portion and the first soldering pad. Moreover, the passivation layer is covered on the top surface of the substrate and has at least one first opening, thereby exposing the first soldering pad and the well.

The present invention uses the extension portion of the first soldering pad to have the solder to be fixed onto the first soldering pad. When being cooled, the first soldering pad will be cooled faster, since the first soldering pad is connected to more leads, and the cooling rate of the first soldering pad is higher than that of the other soldering pads connected with only one lead. Moreover, using the well defined at the connection area of the extension portion and the first soldering pad, the solder is not only soldered onto the top soldering surface and the first lateral soldering surface of the first soldering pad, but also soldered onto the second lateral soldering surface of the first soldering pad through the well.

The present invention achieves a significant advance by changing the copper lead layout of the copper substrate and the shape of the opening of the passivation layer, so the current manufacturing processes of the copper substrate is sufficient without implementing any new manufacturing station or adding additional components. The present invention therefore solves the problems with the prior art, including increased complexity and cost of the manufacturing process and waste of chip space, which were incurred when dealing with the soldering failure of the four corners in the SMT manufacturing processes.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1A:
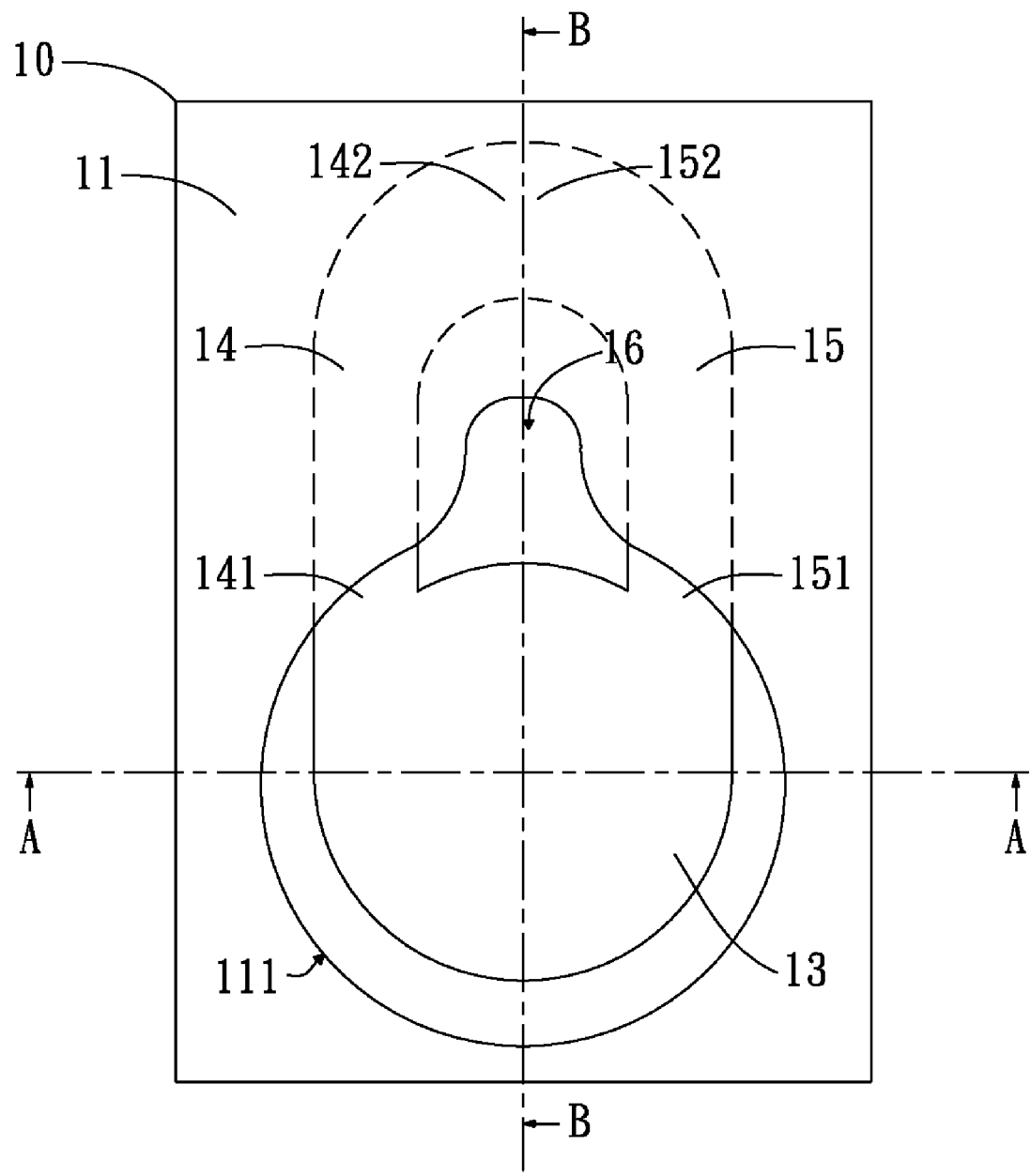
FIG. 1A is a top view of the surface mounting structure for a BGA (Ball Grid Array) according to the first embodiment of the present invention.

Reference will now be made in detail to the present preferred embodiments of the invention, examples of which are illustrated in the accompanying drawings. Wherever possible, the same reference numbers are used in the drawings and the description refers to the same or the like parts.

Figure 1B:
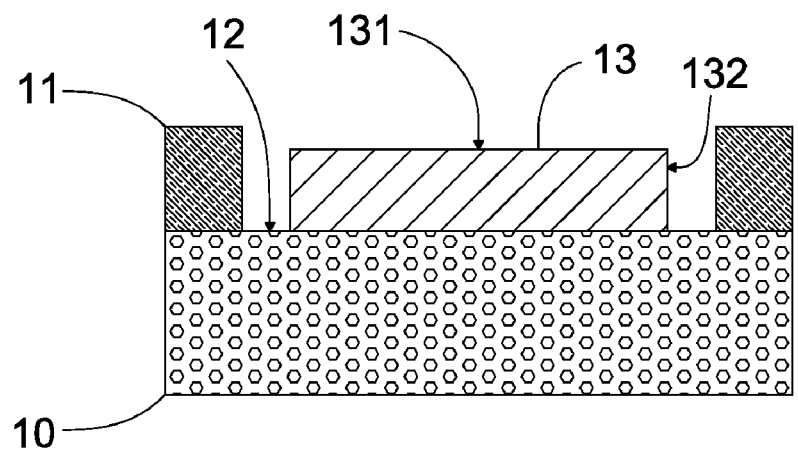
FIG. 1B is a cross-sectional view along the A-A line in FIG. 1A.
Figure 1C:
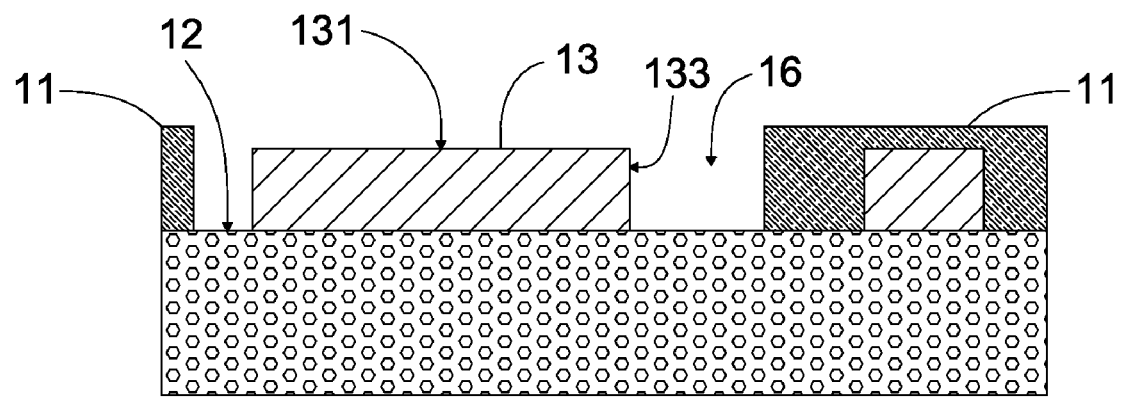
FIG. 1C is a cross-sectional view along the B-B line in FIG. 1A.

Referring to the drawings from FIG. 1A to FIG. 1C, which illustrate the surface mounting structure for a BGA (Ball Grid Array) according to a first embodiment of the present invention. FIG. 1A is a top view of the surface mounting structure for a BGA (Ball Grid Array) according to the first embodiment of the present invention. FIG. 1B is a cross-sectional view along the A-A line in FIG. 1A. FIG. 1C is a cross-sectional view along the B-B line in FIG. B. The surface mounting structure for a BGA includes a substrate 10, at least one first soldering pad 10, at least one first lead 14, at least one second lead 15 and a passivation layer 11.

The substrate 10 has a top surface 12. A first soldering pad 13, a first lead 14, and a second lead 15 are disposed on the top surface 12. The first lead 14 has a first end 141 and a second end 142. The second lead 15 has a third end 151 and a fourth end 152. The first end 141 and the third end 151 are respectively connected to the first soldering pad 13, and the second end 142 is connected to the fourth end 152, thereby defining a well 16 between the first soldering pad 13, the first lead 14, and the second lead 15. The passivation layer 11 covers on the top surface 12 of the substrate 10 to protect the substrate 10 from any external component deemed to be isolated. The passivation layer 11 has at least one first opening 111. The first opening 111 is disposed corresponding to the top side of the first soldering pad 13, thereby exposing the first soldering pad 13 and the well 16.

In addition, the first soldering pad 13 has a top soldering surface 131 at a top side of the first soldering pad 13, a first lateral soldering surface 132 at a lateral side of the first soldering pad 13, and a second lateral soldering surface 133 located at another lateral side of the first soldering pad 13 and in the well 16. The first lateral soldering surface 132 and the second lateral soldering surface 133 are isolated by the first lead 14 and the second lead 15 so as to be free of any connection in between.

Figure 1D:
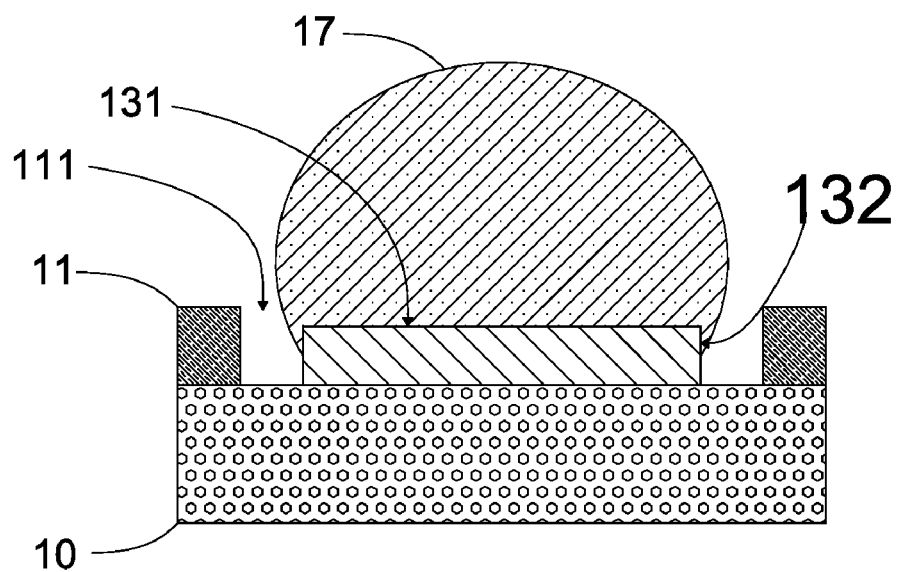
FIG. 1D is a cross-sectional view along the A-A line in FIG. 1A with a solder on the first soldering pad.
Figure 1E:
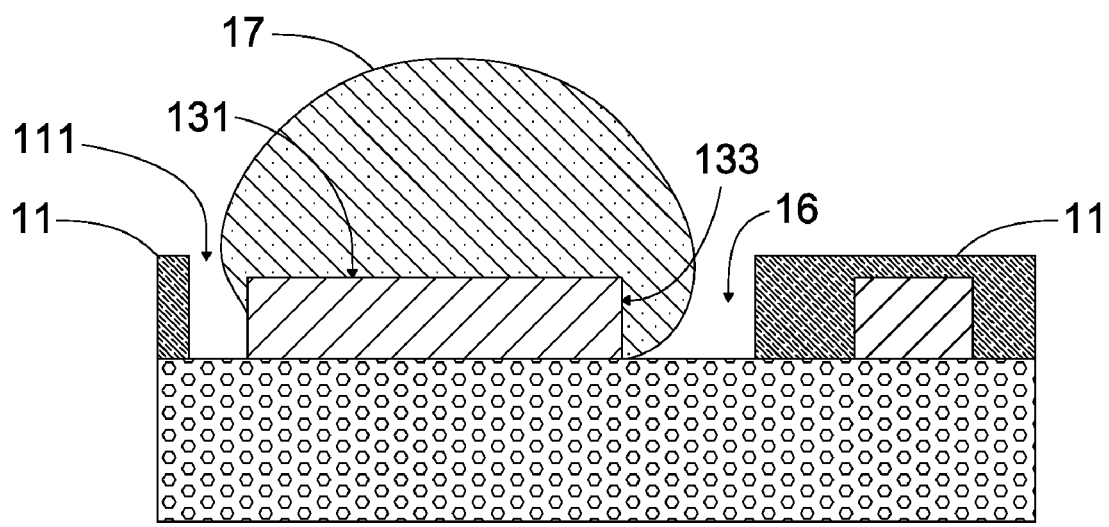
FIG. 1E is a cross-sectional view along the B-B line in FIG. 1A with a solder on the first soldering pad.

Referring to FIG. 1D and FIG. 1E, which are cross-sectional views along the A-A and B-B lines in the first embodiment of the present invention. The present invention further includes a solder 17, and the solder 17 is soldered onto the top soldering surface 131 and the first lateral soldering surface 132 of the first soldering pad 13 through the first opening 111 (as shown in FIG. 1D). The solder 17 is also soldered onto the second lateral soldering surface 133 through the well 16 (as shown in FIG. 1E). The material of the solder 17 is tin, silver, copper, stibium, zinc, nickel, germanium, or various combinations of the foregoing.

Figure 2A:
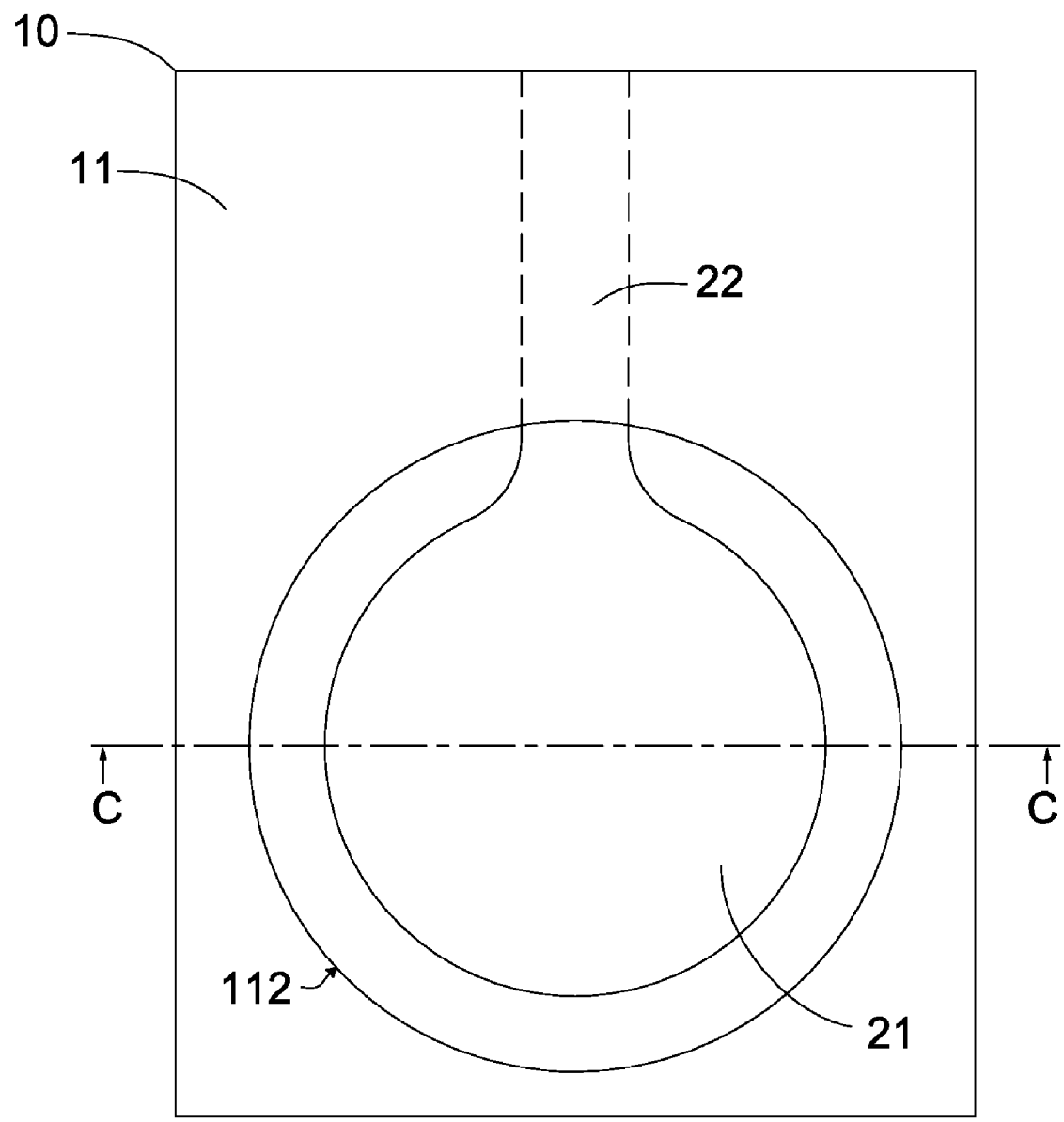
FIG. 2A is a top view of the second soldering pad.
Figure 2B:
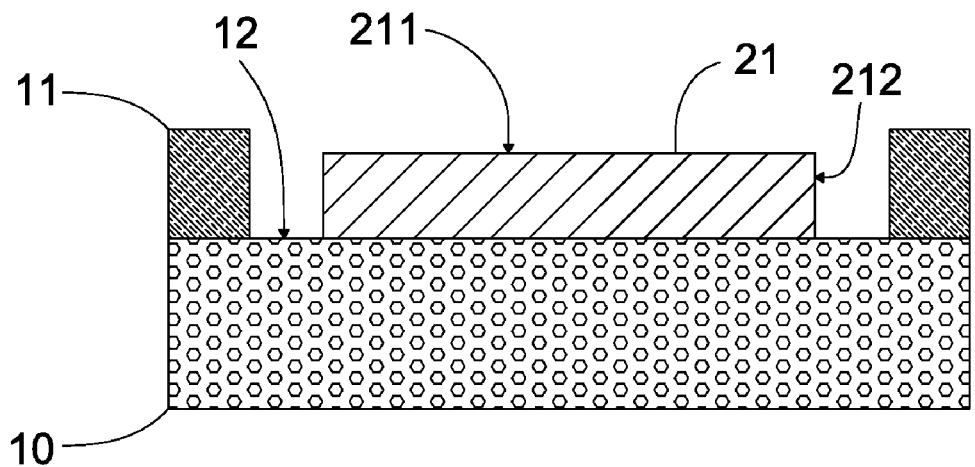
FIG. 2B is a cross-sectional view along the C-C line in FIG. 2A.
Figure 2C:
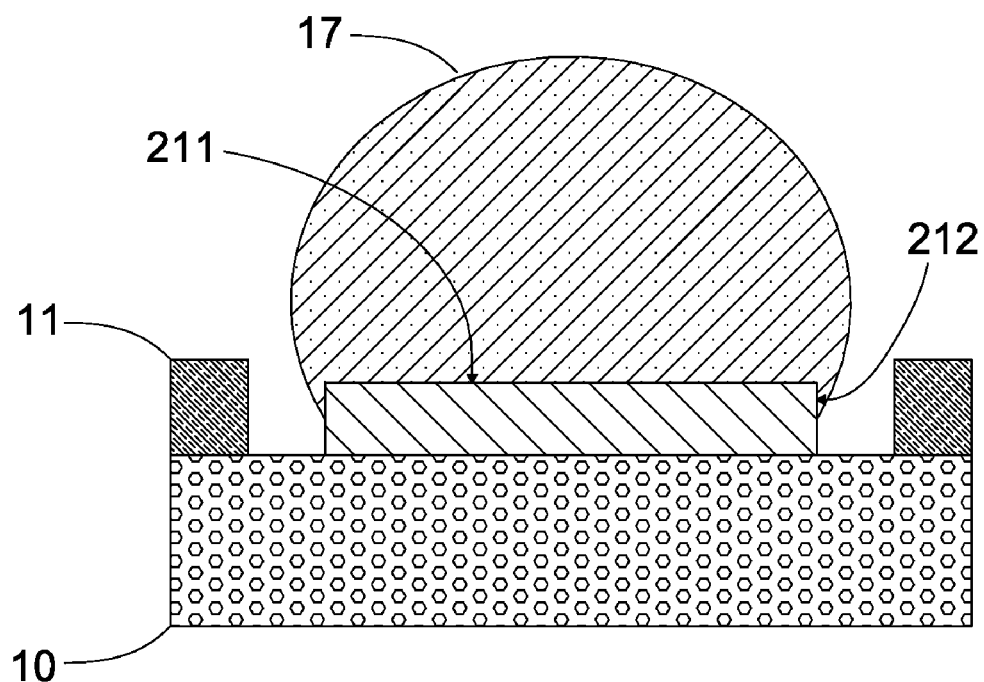
FIG. 2C is a cross-sectional view along the C-C line in FIG. 2A with a solder on the second soldering pad.

FIG. 2A and FIG. 2B are a top view of the second soldering pad 21 and a cross-section view along the C-C cross-section line of the second soldering pad 21. The second embodiment further includes a plurality second soldering pads 21 (only one of the second soldering pads 21 is shown in the drawing). Each of the second soldering pads 21 is disposed on the top surface 12 of the substrate 10 and connected to the third pin 22. Each of the second soldering pads 21 has a top soldering surface 211 and first lateral soldering surface 212. The passivation layer 11 has a plurality of second openings 112 (only one of the second openings 112 is shown in the drawing), respectively disposed corresponding to the top side of the second soldering pad 21, thereby exposing the second soldering pad 21. Moreover, the solder 17 is soldered onto the top soldering surface 211 and the first lateral soldering surface 212 of the second soldering pad 21 through the second opening 112, as shown in FIG. 2C.

Figure 3A:
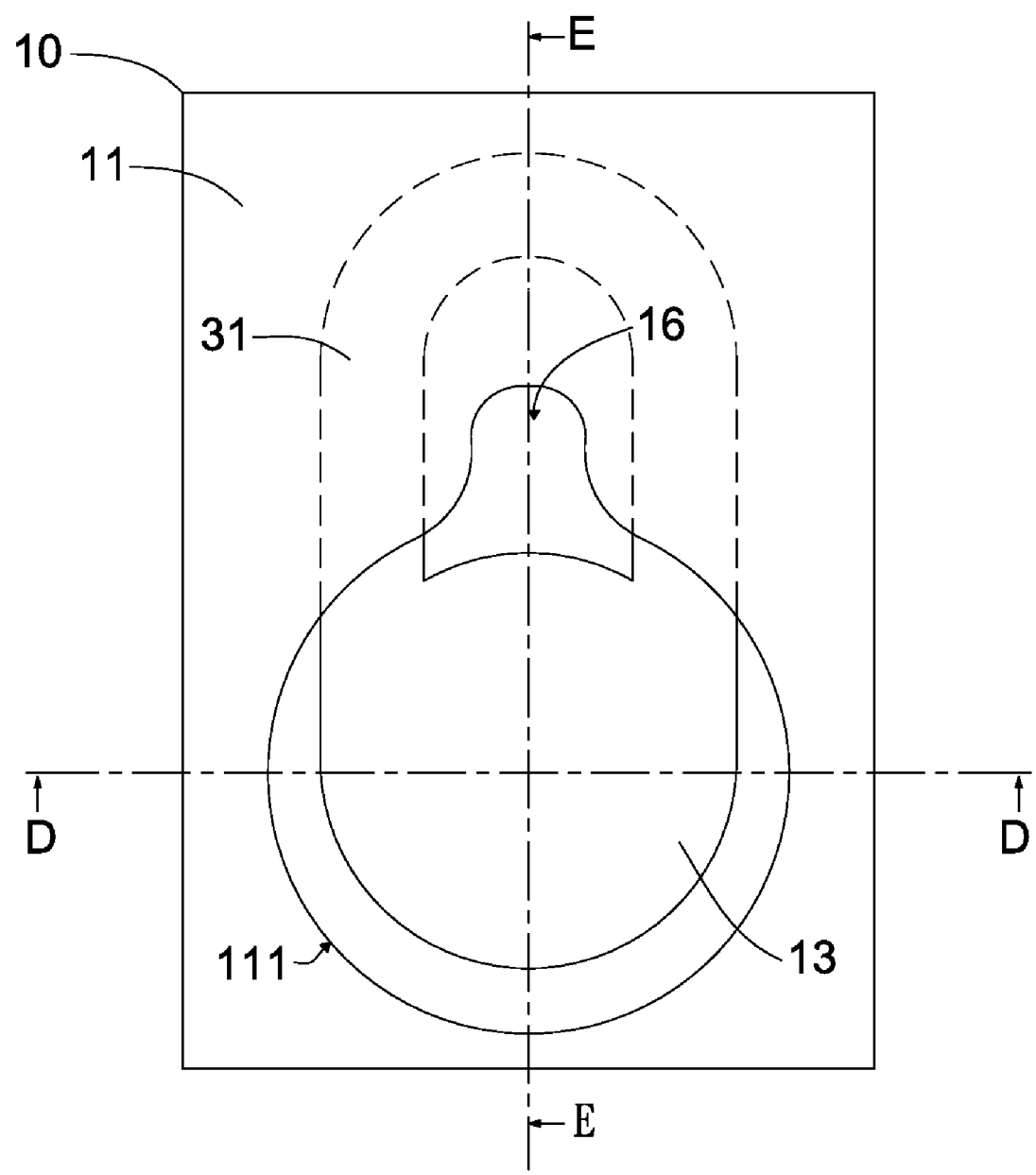
FIG. 3A is a top view in the second embodiment of the present invention.
Figure 3B:
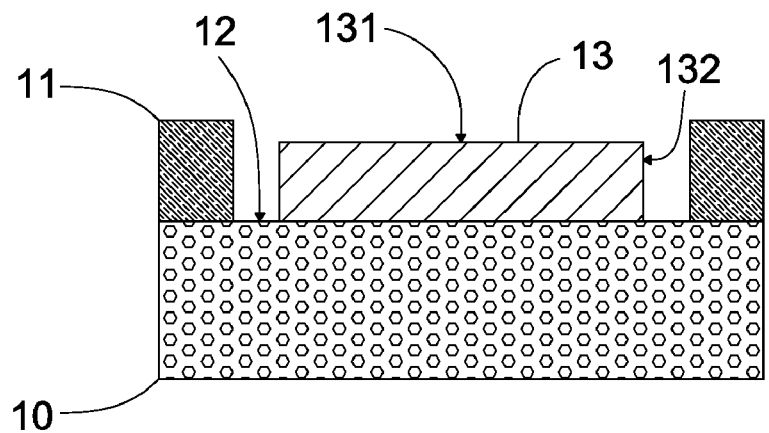
FIG. 3B is a cross-sectional view along the D-D line in FIG. 3A.
Figure 3C:
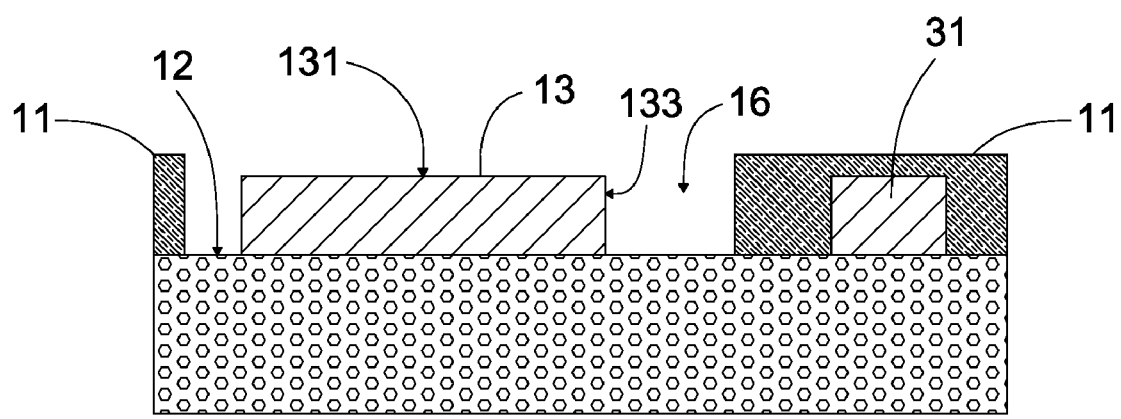
FIG. 3C a cross-sectional view along the E-E line in FIG. 3A.

Referring to FIG. 3A to FIG. 3C, a second embodiment of the present invention is shown. The surface mounting structure includes a substrate 10, at least one first soldering pad 13, at least one extension portion 31, and a passivation layer 11.

The substrate 10 has a top surface 12. The first soldering pad 13 and the extension portion 31 are disposed on the top surface 12. The extension portion 31 is connected to the first soldering pad 13, and a well 16 is defined in the connection area of the extension portion 31 and the first soldering pad 13. Furthermore, the passivation layer 11 is covered on the top surface 12 of the substrate 10, thereby protecting the substrate 10 from any external component deemed to be isolated. The passivation layer 11 has at least one first opening 111. The first opening 111 is disposed corresponding to the top side of the first soldering pad 13, so as to expose the first soldering pad 13 and the well 16.

Moreover, the first soldering pad 13 has a top soldering surface 131 at a top side of the first soldering pad 13, a first lateral soldering surface 132 at a lateral side of the first soldering pad 13, and a second lateral soldering surface 133 located at another lateral side of the first soldering pad 13 and in the well 16. The first lateral soldering surface 132 and the second lateral soldering surface 133 are isolated by the extension portion 31 so as to be free of connections in between.

Figure 3D:
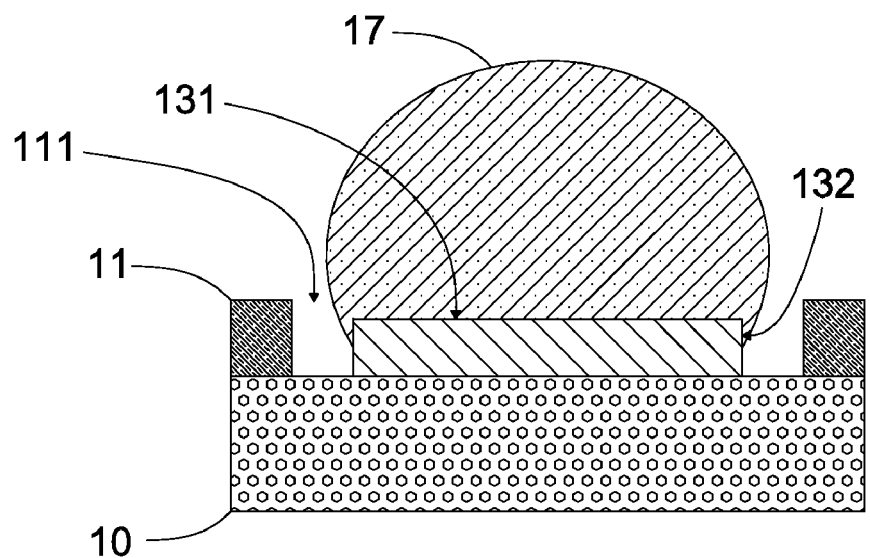
FIG. 3D is a cross-sectional view along the D-D line in FIG. 3A with a solder on the first soldering pad.
Figure 3E:
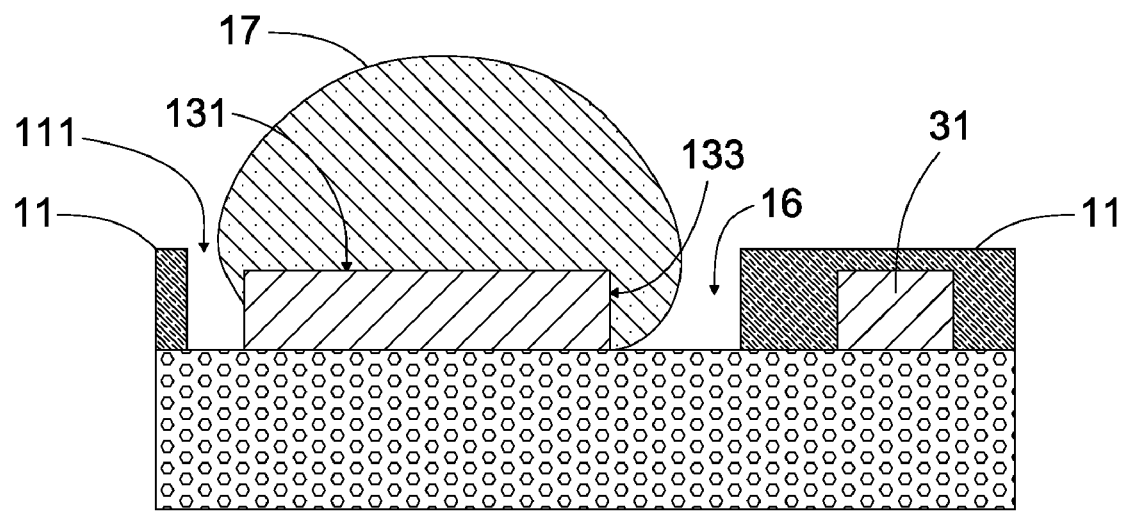
FIG. 3E is a cross-sectional view along the E-E line in FIG. 3A with a solder on the first soldering pad.

The present embodiment further includes a solder 17, as shown in FIG. 3D and FIG. 3E, which are cross-section views along the D-D and E-E cross-section lines with the solder 17 soldered onto the first soldering pad 13 in the second embodiment of the present invention. The solder 17 is soldered onto top soldering surface 131 and the first lateral soldering surface 132 of the first soldering pad 13 through the first opening 111 (as shown in FIG. 3D), and is soldered onto the second lateral soldering surface 133 through the well 16, as shown in FIG. 3E; wherein the solder 17 is made of tin, silver, copper, stibium, zinc, nickel, germanium, or the combinations of the foregoing.

Figure 4:
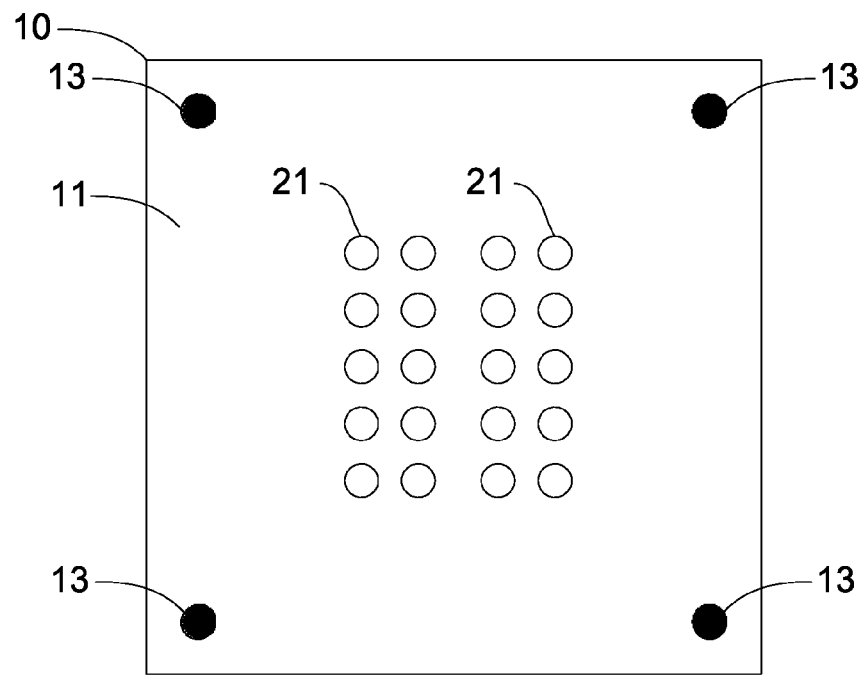
FIG. 4 is a top view (1) of a substrate illustrating distribution of the soldering pads in the present invention.

Referring to FIG. 4, a top view (1) of a substrate illustrating distribution of the soldering pads in the present invention is shown. The first soldering pad 13 is disposed in corners of the top surface 12 covered by the passivation layer 11. Each of the corner has a first soldering pad 13, so the four corners have total four first soldering pads 13. The second soldering pads 21 are disposed in the middle area. Namely, in FIG. 4 the four first soldering pads 13 each having a well located at the edge are respectively disposed in each of the four corners to strengthen the fixation strength of the corners of an IC chip and secure the four corners from the problem of soldering failure.

Figure 5:
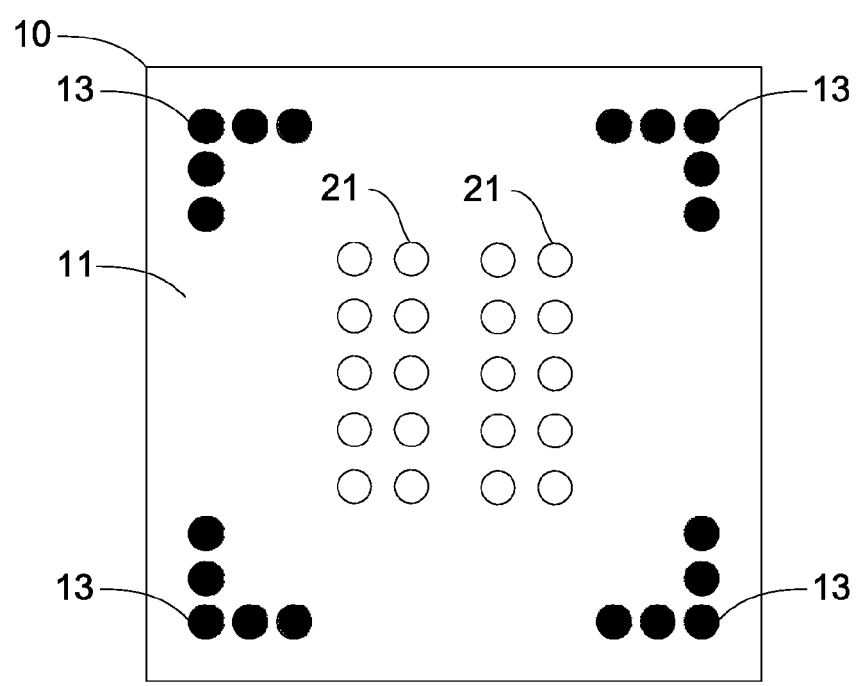
FIG. 5 is a top view (2) of a substrate illustrating distribution of the soldering pads in the present invention.

Referring to FIG. 5, a top view (2) of a substrate illustrating distribution of the soldering pads in the present invention is shown. The first soldering pad 13 is disposed in the corners of the top surface 12 covered by the passivation layer 11. Each of the corners has five first soldering pads 13 disposed thereon, so there are twenty first soldering pads 13 disposed in the corners. The second soldering pads 21 are disposed in the middle area. Namely, in FIG. 4 one first soldering pad 13 with the well at the edge is disposed in each of the four corner areas. In FIG. 5, every corner is further disposed with five first soldering pads 13, each having a well at the edge. There are a total of twenty first soldering pads 13, which can further improve the fixation strength of the four corner areas.

Additional advantages and modifications will readily occur to those proficient in the relevant fields. The invention in its broader aspects is therefore not limited to the specific details and representative embodiments shown and described herein. Accordingly, various modifications may be made without departing from the spirit or scope of the general inventive concept as defined by the appended claims and their equivalents.

What is claimed is:

1. A surface mounting structure for a ball grid array, comprising:
    a substrate, having a top surface;
    at least one first soldering pad, disposed on the top surface;
    at least one first lead, disposed on the top surface, and the first lead having a first end connected to the first soldering pad and a second end;
    at least one second lead, disposed on the top surface, and the second lead having a third end connected to the first soldering pad and a fourth end connected to the second end to define a well among the first soldering pad, the first lead and the second lead; and
    a passivation layer, covering on the top surface, and the passivation layer having at least one first opening corresponding to the top side of the first soldering pad to expose the first soldering pad and the well.

2. The surface mounting structure as claimed in claim 1, wherein the first soldering pad is located at a corner of the top surface.

3. The surface mounting structure as claimed in claim 1, wherein the first soldering pad is located a surrounding area of the top surface.

4. The surface mounting structure as claimed in claim 1, wherein the first soldering pad has a top soldering surface at a top side of the first soldering pad, a first lateral soldering surface at a lateral side of the first soldering pad, and a second lateral soldering surface located at another lateral side of the first soldering pad and in the well.

5. The surface mounting structure as claimed in claim 4, further comprising a solder which is soldered onto the top soldering surface and the first lateral soldering surface of the first soldering pad through the first opening, and is soldered onto the second lateral soldering surface through the well.

6. The surface mounting structure as claimed in claim 5, wherein the material of solder is selected from the group consisting of tin, silver, copper, stibium, zinc, nickel, and germanium.

7. The surface mounting structure as claimed in claim 1 further comprising:
    a plurality of second soldering pads, disposed on the top surface, each of the second soldering pads being respectively connected to a third pin.

8. The surface mounting structure as claimed in claim 7, wherein each of the second soldering pads has a top soldering surface and a first lateral soldering surface.

9. The surface mounting structure as claimed in claim 8, wherein the passivation layer has a plurality of second openings, each respectively disposed corresponding to the top side of each of the second soldering pads to expose the second soldering pads.

10. The surface mounting structure as claimed in claim 9, further comprising a solder which is soldered onto the top soldering surface and the first lateral soldering surface of each of the second soldering pads through the second openings respectively.

11. A surface mounting structure for a ball grid array, comprising:
    a substrate, having a top surface;
    at least one first soldering pad, disposed on the top surface;
    at least one extension portion, disposed on the top surface and connected to the first soldering pad, a well being defined in a connection area of the extension portion and the first soldering pad; and
    a passivation layer, covering the top surface, and the passivation layer having at least one first opening, the first opening being disposed at the top side of the first soldering pad to expose the first soldering pad and the well.

12. The surface mounting structure as claimed in claim 11, wherein the first soldering pad is disposed at a corner area of the top surface.

13. The surface mounting structure as claimed in claim 11, wherein the first soldering pad is disposed at a surrounding area of the top surface.

14. The surface mounting structure as claimed in claim 11, wherein the first soldering pad has a top soldering surface at a top side of the first soldering pad, a first lateral soldering surface at a lateral side of the first soldering pad, and a second lateral soldering surface located at another lateral side of the first soldering pad and in the well.

15. The surface mounting structure as claimed in claim 14, further comprising a solder which is soldered onto the top soldering surface and the first lateral soldering surface of the first soldering pad through the first opening, and is soldered onto the second lateral soldering surface through the well.

16. The surface mounting structure as claimed in claim 15, wherein the material of the solder is selected from the group consisting of tin, silver, copper, stibium, zinc, nickel, and germanium.

17. The surface mounting structure as claimed in claim 11 further comprising:
   a plurality of second soldering pads, disposed on the top surface, and each of the second soldering pads being connected to a third pin.

18. The surface mounting structure as claimed in claim 17, wherein each of the second soldering pads has a top soldering surface and a first lateral soldering surface.

19. The surface mounting structure as claimed in claim 18, wherein the passivation layer has a plurality of second openings, each of the second openings being respectively disposed corresponding to the top side of each of the second soldering pads so as to expose the second soldering pads.

20. The surface mounting structure as claimed in claim 19, wherein the solder is soldered onto the top soldering surface and the first lateral soldering surface of each of the second soldering pads through the second openings respectively.

* * * * *